United States Patent
Yao et al.

(10) Patent No.: US 8,012,824 B2
(45) Date of Patent: *Sep. 6, 2011

(54) PROCESS TO MAKE HIGH-K TRANSISTOR DIELECTRICS

(75) Inventors: Liang-Gi Yao, Hsin-Chu (TW);
Ming-Fang Wang, Taichung (TW);
Shih-Chang Chen, Taoyuan (TW);
Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1300 days.

This patent is subject to a terminal disclaimer.

(21) Appl. No.: 11/454,596

(22) Filed: Jun. 16, 2006

(65) Prior Publication Data
US 2006/0246698 A1 Nov. 2, 2006

Related U.S. Application Data

(62) Division of application No. 10/125,216, filed on Apr. 18, 2002, now Pat. No. 7,087,480.

(51) Int. Cl.
*H01L 21/00* (2006.01)

(52) U.S. Cl. ............ 438/240; 438/286; 438/287

(58) Field of Classification Search ............ 438/240, 438/286–287
See application file for complete search history.

(56) References Cited

U.S. PATENT DOCUMENTS

| | | | |
|---|---|---|---|
| 5,904,517 | A | 5/1999 | Gardner et al. |
| 6,008,095 | A | 12/1999 | Gardner et al. |
| 6,090,723 | A | 7/2000 | Thakur et al. |
| 6,114,228 | A | 9/2000 | Gardner et al. |
| 6,153,477 | A | 11/2000 | Gardner et al. |
| 6,271,094 | B1 | 8/2001 | Boyd et al. |
| 6,294,420 | B1 | 9/2001 | Tsu et al. |
| 6,420,279 | B1 * | 7/2002 | Ono et al. ............ 438/785 |
| 6,441,421 | B1 * | 8/2002 | Clevenger et al. ............ 257/296 |
| 6,455,330 | B1 * | 9/2002 | Yao et al. ............ 438/3 |
| 6,461,931 | B1 | 10/2002 | Eldridge |
| 6,462,360 | B1 | 10/2002 | Higgins et al. |
| 6,472,276 | B1 | 10/2002 | Hilt et al. |
| 6,472,694 | B1 | 10/2002 | Wilson et al. |
| 6,498,358 | B1 | 12/2002 | Lach et al. |
| 6,511,876 | B2 | 1/2003 | Buchanan et al. |
| 6,656,764 | B1 | 12/2003 | Wang et al. |
| 6,716,707 | B1 | 4/2004 | Brask et al. |
| 6,753,230 | B2 * | 6/2004 | Sohn et al. ............ 438/289 |
| 6,764,927 | B1 * | 7/2004 | Yao et al. ............ 438/478 |
| 6,858,524 | B2 * | 2/2005 | Haukka et al. ............ 438/585 |
| 6,875,677 | B1 * | 4/2005 | Conley et al. ............ 438/585 |
| 6,899,858 | B2 * | 5/2005 | Zhuang et al. ............ 423/395 |
| 6,913,961 | B2 * | 7/2005 | Hwang ............ 438/216 |
| 6,914,313 | B2 | 7/2005 | Wang et al. |
| 7,015,138 | B2 * | 3/2006 | Pan et al. ............ 438/653 |
| 7,060,571 | B1 * | 6/2006 | Ngo et al. ............ 438/287 |
| 7,079,975 | B1 * | 7/2006 | Halliyal et al. ............ 702/172 |
| 7,087,480 | B1 * | 8/2006 | Yao et al. ............ 438/240 |
| 7,115,530 | B2 * | 10/2006 | Quevedo-Lopez et al. ... 438/778 |
| 7,332,435 | B2 * | 2/2008 | Shih et al. ............ 438/686 |
| 7,372,112 | B2 * | 5/2008 | Iwamoto et al. ............ 257/411 |

(Continued)

*Primary Examiner* — Laura M Menz

(74) *Attorney, Agent, or Firm* — Haynes and Boone, LLP

(57) ABSTRACT

A method of reducing impurities in a high-k dielectric layer comprising the following steps. A substrate is provided. A high-k dielectric layer having impurities is formed over the substrate. The high-k dielectric layer being formed by an MOCVD or an ALCVD process. The high-k dielectric layer is annealed to reduce the impurities within the high-k dielectric layer.

19 Claims, 1 Drawing Sheet

U.S. PATENT DOCUMENTS

| | | | |
|---|---|---|---|
| 7,393,736 B2 * | 7/2008 | Ahn et al. | 438/197 |
| 7,396,719 B2 * | 7/2008 | Kim et al. | 438/240 |
| 7,425,514 B2 * | 9/2008 | Yeo et al. | 438/785 |
| 7,482,234 B2 * | 1/2009 | Iwamoto et al. | 438/287 |
| 7,489,545 B2 * | 2/2009 | Forbes et al. | 365/185.05 |
| 7,494,857 B2 * | 2/2009 | Chen et al. | 438/197 |
| 7,564,102 B2 * | 7/2009 | Yoshihara | 257/369 |
| 2002/0140102 A1 * | 10/2002 | Pan et al. | 257/762 |
| 2003/0096473 A1 * | 5/2003 | Shih et al. | 438/240 |
| 2004/0009679 A1 * | 1/2004 | Yeo et al. | 438/785 |
| 2004/0038538 A1 | 2/2004 | Ho et al. | |
| 2004/0087075 A1 | 5/2004 | Wang et al. | |
| 2004/0104439 A1 * | 6/2004 | Haukka et al. | 257/368 |
| 2004/0180523 A1 | 9/2004 | Brask et al. | |
| 2004/0215030 A1 * | 10/2004 | Norman | 556/413 |
| 2004/0222474 A1 | 11/2004 | Chau et al. | |
| 2005/0023576 A1 | 2/2005 | Lee et al. | |
| 2005/0070123 A1 * | 3/2005 | Hirano | 438/778 |
| 2005/0074978 A1 | 4/2005 | Wang et al. | |
| 2005/0084610 A1 * | 4/2005 | Selitser | 427/248.1 |
| 2005/0104112 A1 * | 5/2005 | Haukka et al. | 257/310 |
| 2005/0110098 A1 * | 5/2005 | Yoshihara | 257/371 |
| 2005/0116306 A1 * | 6/2005 | Iwamoto et al. | 257/411 |
| 2005/0124109 A1 * | 6/2005 | Quevedo-Lopez et al. | 438/240 |
| 2005/0132549 A1 * | 6/2005 | Shih et al. | 29/25.41 |
| 2005/0158974 A1 | 7/2005 | Chau et al. | |
| 2005/0167777 A1 | 8/2005 | Lee | |
| 2005/0196927 A1 | 9/2005 | Wang et al. | |
| 2006/0001111 A1 * | 1/2006 | Tsuchiya et al. | 257/410 |
| 2006/0091554 A1 * | 5/2006 | Pan et al. | 257/762 |
| 2006/0121744 A1 * | 6/2006 | Quevedo-Lopez et al. | 438/785 |
| 2006/0180877 A1 * | 8/2006 | Iwamoto et al. | 257/410 |
| 2006/0205214 A1 * | 9/2006 | Shih et al. | 438/682 |
| 2006/0246698 A1 * | 11/2006 | Yao et al. | 438/591 |
| 2006/0267116 A1 * | 11/2006 | Shimamoto et al. | 257/411 |
| 2008/0166867 A1 * | 7/2008 | Iwamoto et al. | 438/592 |

* cited by examiner

PROCESS TO MAKE HIGH-K TRANSISTOR DIELECTRICS

This application is a division of U.S. Ser. No. 10/125,216 filed Apr. 18, 2002.

FIELD OF THE INVENTION

The present invention relates generally to semiconductor fabrication and more specifically to processes of fabricating high-k dielectric layers.

BACKGROUND OF THE INVENTION

Current high-k gate dielectric processes developed to meet the future transistor performance requirements in the 0.10 μm generation and beyond consist of generally two types: atomic layer chemical vapor deposition (ALCVD) and metal organic chemical vapor deposition (MOCVD). These processes permit formation of the necessary high-k film thickness and thickness uniformity.

However, MOCVD processes introduce undesired carbon (C)-containing impurities and the more mature ALCVD processes which use chlorine (Cl)-containing precursors create a sufficiently high chlorine content in the high-k films that degrades the electric performance of the devices using those high-k films.

For example, while an MOCVD process may use $Zr(OC_2H_5)_4$ to form an $ZrO_2$ film, carbon impurities (and hydrogen impurities) are formed in the high-k $ZrO_2$ dielectric layer.

In another example, in an ALCVD process $H_2O$ is pulsed, then purged and then an $HfCl_4$ precursor is pulsed then purged to form an $HfO_2$ film. However, chlorine (Cl) impurities are formed in the high-k $HfO_2$ film, especially proximate the interface between the HfO film and the substrate over which it is formed. ALCVD processes generally have a low process temperature of from about 250 to 350° C.

U.S. Pat. No. 6,271,094 B1 to Boyd et al. describes a method of making MOSFET with a high dielectric constant (k) gate insulator and minimum overlap capacitance.

U.S. Pat. No. 6,153,477 to Gardner et al. describes a process of forming an ultra-short transistor channel length using a gate dielectric having a relatively high dielectric constant.

U.S. Pat. No. 6,114,228 to Gardner et al. describes a method of making a semiconductor device with a composite gate dielectric layer and gate barrier layer.

U.S. Pat. No. 6,090,723 to Thakur et al. describes conditioning processes including annealing or high-k dielectrics.

U.S. Pat. No. 6,008,095 to Gardner et al. describes a process for the formation of isolation trenches with high-k gate dielectrics.

SUMMARY OF THE INVENTION

Accordingly, it is an object of one or more embodiments of the present invention to provide a improved process of forming high-k dielectric layers.

It is another object of one or more embodiments of the present invention to provide an improved annealing process for repairing defects at silicon/high-k dielectric layer interfaces.

Other objects will appear hereinafter.

It has now been discovered that the above and other objects of the present invention may be accomplished in the following manner. Specifically, a substrate is provided. A high-k dielectric layer having impurities is formed over the substrate. The high-k dielectric layer being formed by an MOCVD or an ALCVD process. The high-k dielectric layer is annealed to reduce the impurities within the high-k dielectric layer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Initial Structure

Figure 1:
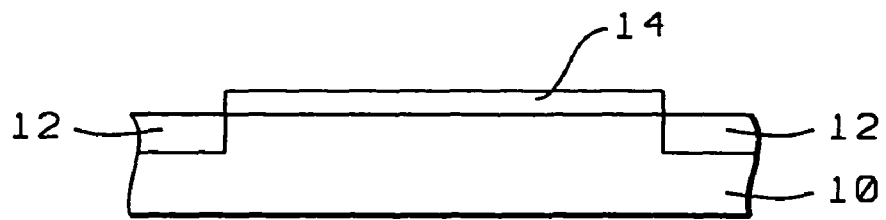
FIGS. 1 to 4 schematically illustrate a preferred embodiment of the present invention.

As shown in FIG. 1, structure 10 includes shallow trench isolation (STI) structures 12 formed therein. Structure 10 is preferably a silicon substrate and is understood to possibly include a semiconductor wafer or substrate. STIs 12 are comprised of thermal oxide, SACVD oxide or HDP-CVD oxide and are more preferably HDP-CVD oxide.

A high-k dielectric layer 14 is formed over silicon substrate 10 generally between STIs 12 to a thickness of preferably from about 5 to 200 Å and more preferably from about 20 to 100 Å. High-k dielectric layer 14 is preferably comprised of a metal oxide or a metal silicate formed by either an MOCVD process which introduces carbon (and hydrogen) impurities or an ALCVD process which introduces chlorine impurities, and does not decompose under the annealing 16 conditions of the present invention.

High-k dielectric layer 14 is preferably: (1) a metal oxide such as $HfO_2$, $ZrO_2$, $La_2O_3$, $Y_2O_3$, $Al_2O_3$ or $TiO_2$ and more preferably $HfO_2$, $ZrO_2$ or $Al_2O_3$; or (2) a metal silicate such as $HfSi_xO_y$, $ZrSi_xO_y$, $LaSi_xO_y$, $YSi_xO_y$, $AlSi_xO_y$ or $TiSi_xO_y$ and more preferably $HfSi_xO_y$ or $ZrSi_xO_y$.

Anneal of Deposited High-k Dielectric Layer 14—One Key Step of the Invention

Figure 2:
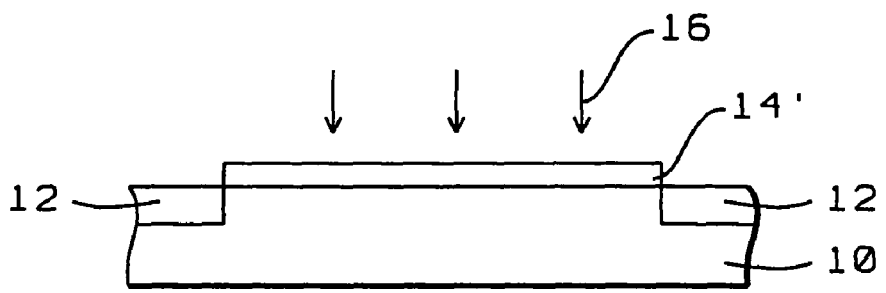

In one key step of the invention and as illustrated in FIG. 2, the deposited high-k dielectric layer 14 is annealed 16 at a temperature of preferably from about 280 to 820° C., more preferably from about 300 to 800° C. and most preferably from about 300 to 700° C. for preferably from about 0.5 to 300 seconds, more preferably from about 2 to 100 seconds for rapid thermal anneal (RTA) process and from about 5 to 300 minutes for furnace annealing processes to drive out the chlorine; and carbon and hydrogen impurities to form an impurity-free high-k dielectric layer 14'. That is the chlorine, carbon and/or hydrogen impurities are reduced to preferably less than about 20% to 2 times which improves the electrical performance of the subsequently formed transistors/devices incorporating impurity-free high-k dielectric layer 14'.

The anneal 16 is preferably by rapid thermal processing (RTP) or by a furnace anneal and is conducted so as to minimize recrystallization of the high-k dielectric layer 14. The anneal 16 is carried out in the presence of ambients that are preferably $H_2$, $N_2$, $H_2/N_2$, $H_2/O_2$, $O_2/N_2$, He or Ar and are more preferably $H_2/N_2$ or $O_2/N_2$. The presence of oxygen ($O_2$) is kept low to avoid additional oxidation of the high-k dielectric layer 14.

Formation of Gate Layer 18

Figure 3:
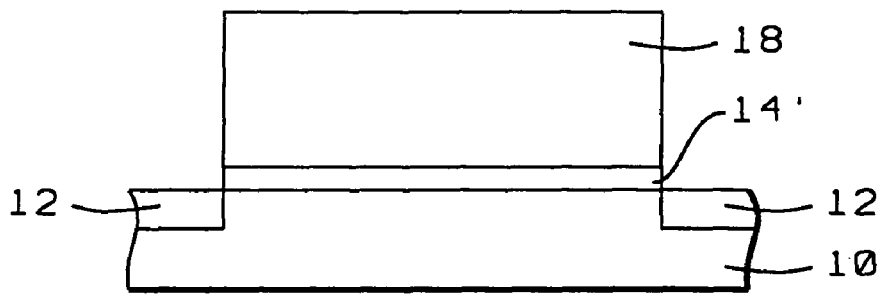

As shown in FIG. 3, a gate layer 18 is formed over impurity-free high-k dielectric layer 14' to a thickness of preferably from about 100 to 3000 Å and more preferably from about 500 to 2000 Å. Gate layer 18 is preferably comprised of polysilicon (poly) or a metal (metal gate) such as TaN/W, TiN/W, TaN/Al or TiN/Al and is more preferably polysilicon.

Further Processing

Figure 4:
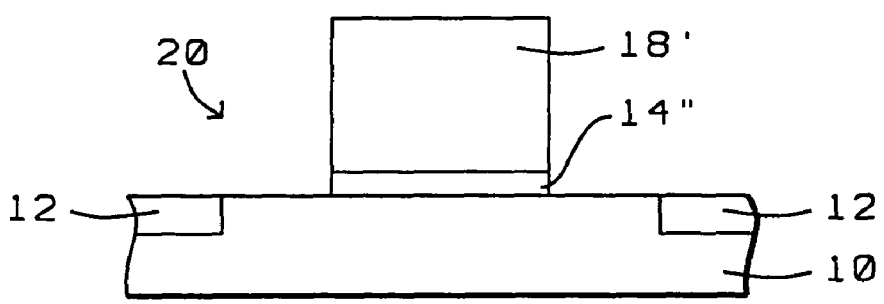

Further processing may then proceed. For example, as shown in FIG. 4, gate layer 18 and impurity-free high-k dielectric layer 14' are patterned to form gate electrode 20 comprised of patterned gate layer 18' and impurity-free high-k dielectric layer 14".

Additional processing may continue thereafter. For example, silicide formation, LDD implants, gate sidewall spacer formation, HDD implants, etc. to complete formation of a transistor or device incorporating gate electrode 20.

Advantages of the Present Invention

The advantages of one or more embodiments of the present invention include:
1. improved transistor/device electrical performance; and
2. improved process for high-k film quality.

While particular embodiments of the present invention have been illustrated and described, it is not intended to limit the invention, except as defined by the following claims.

We claim:

1. A method of reducing impurities in a high-k dielectric layer, comprising the steps of: providing a substrate having STIs formed therein; forming a high-k dielectric layer between the STIs; the high-k dielectric layer having impurities therein and being formed by an ALCVD process; annealing the high-k dielectric layer to reduce the impurities within the high-k dielectric layer without additional oxidation of the high-k dielectric layer; and forming a gate layer upon the annealed high-k dielectric layer.

2. The method of claim 1, wherein the substrate is a silicon substrate; and the high-k dielectric layer is a metal oxide or a metal silicate and is formed by either an MOCVD process or an ALCVD process.

3. The method of claim 1, wherein the high-k dielectric layer is comprised of a material selected from the group consisting of $HfO_2$, $ZrO_2$, $La_2O_3$, $Y_2O_3$, $Al_2O_3$, $TiO_2$, $HfSi_xO_y$, $ZrSi_xO_y$, $LaSi_xO_y$, $YSi_xO_y$, $AlSi_xO_y$, and $TiSi_xO_y$.

4. The method of claim 1, wherein the high-k dielectric layer is comprised of a material selected from the group consisting of $HfO_2$, $ZrO_2$, $Al_2O_3$, $HfSi_xO_y$, and $ZrSi_xO_y$.

5. The method of claim 1, wherein the high-k dielectric layer anneal is a rapid thermal anneal conducted at a temperature of from about 280 to 820° C. for from about 0.5 to 300 seconds.

6. The method of claim 1, wherein the high-k dielectric layer anneal is a rapid thermal anneal conducted at a temperature of from about 300 to 800° C. for from about 2 to 100 seconds.

7. The method of claim 1, wherein the high-k dielectric layer anneal is a furnace anneal process conducted at a temperature of from about 300 to 800° C. for from about 5 to 300 minutes.

8. The method of claim 1, wherein the high-k dielectric layer anneal is conducted using either rapid thermal processing or a furnace anneal process.

9. The method of claim 1, wherein the high-k dielectric layer anneal is conducted using either a rapid thermal processing or a furnace anneal process using an ambient selected from the group consisting of $H_2$, $N_2$, $H_2/N_2$, $H_2/O_2$, $O_2/N_2$, He and Ar.

10. The method of claim 1, wherein the high-k dielectric layer anneal is conducted using either a rapid thermal processing or a furnace anneal process using an ambient selected from the group consisting of $H_2/N_2$ and $O_2/N_2$.

11. The method of claim 1, wherein the STIs are comprised of a material selected from the group consisting of thermal oxide, SACVD oxide and HDP-CVD oxide.

12. The method of claim 1, wherein the high-k dielectric layer anneal is conducted at a temperature of from about 280 to 820° C. using either rapid thermal processing or a furnace anneal process with an ambient selected from the group consisting of $H_2$, $N_2$, $H_2/N_2$, $H_2/O_2$, $O_2/N_2$.

13. The method of claim 1, wherein the high-k dielectric layer anneal is conducted at a temperature of from about 300 to 800° C. using either rapid thermal processing or a furnace anneal process with an ambient selected from the group consisting of $H_2/N_2$ and $O_2/N_2$.

14. The method of claim 1, wherein the high-k dielectric layer has a thickness of from about 5 to 200 Å.

15. The method of claim 1, wherein the high-k dielectric layer has a thickness of from about 20 to 100 Å.

16. The method of claim 1, wherein the gate layer comprised of a material selected from the group consisting of polysilicon, TaN/W, TiN/W, TaN/Al and TiN/Al.

17. The method of claim 1, wherein the gate layer is comprised of polysilicon.

18. The method of claim 1, wherein the gate layer has a thickness of from about 100 to 3000 Å.

19. The method of claim 1, wherein the gate layer has a thickness of from about 500 to 2000 Å.

* * * * *